United States Patent [19]

Nose et al.

[11] Patent Number: 5,130,554
[45] Date of Patent: Jul. 14, 1992

[54] TWO-DIMENSIONAL SCANNING DEVICE FOR DETECTING POSITION BETWEEN TWO RELATIVELY MOVABLE OBJECTS

[75] Inventors: Hiroyasu Nose, Zama; Akihiko Yamano, Yokohama; Takahiro Oguchi, Atsugi; Toshihiko Miyazaki, Isehara; Toshimitsu Kawase, Atsugi, all of Japan

[73] Assignee: Canon Kabushiki Kaisha, Tokyo, Japan

[21] Appl. No.: 780,452

[22] Filed: Oct. 22, 1991

Related U.S. Application Data

[63] Continuation of Ser. No. 524,490, May 17, 1990.

[30] Foreign Application Priority Data

May 17, 1989 [JP] Japan .................. 1-121560
May 29, 1989 [JP] Japan .................. 1-132836

[51] Int. Cl.$^5$ .............................................. G01N 21/86
[52] U.S. Cl. ..................................... 250/548; 356/400
[58] Field of Search ................... 250/561, 548, 557; 356/399–400

[56] References Cited

U.S. PATENT DOCUMENTS

| | | | |
|---|---|---|---|
| 4,631,416 | 12/1986 | Trutna, Jr. et al. | 250/548 |
| 4,664,524 | 5/1987 | Hattori et al. | 250/548 |
| 4,785,189 | 11/1988 | Wells | 250/492.2 |
| 4,870,289 | 9/1989 | Sato et al. | 356/400 |
| 4,900,030 | 2/1990 | Aoyama | 250/548 |

FOREIGN PATENT DOCUMENTS

| | | |
|---|---|---|
| 0304893 | 3/1989 | European Pat. Off. . |
| 62-209302 | 9/1987 | Japan . |

OTHER PUBLICATIONS

Binning, et al. "Surface Studies by Scanning Tunnelling Microscopy," The American Physical Society, Physical Review Letters, vol. 49, pp. 57 through 61 (Dec. 1982).
Ringger, et al., "Nanometer Lithography With the Scanning Tunneling Microscope," Applied Physics Letters, vol. 46, No. 9, pp. 832 through 834 (May 1985).
H. Kawakatsu, et al., "Design of a Positioning Table Using Crystalline Lattice and Surface Topography as a Reference Index", vol. 40, No. 12, pp. 25 through 27 (Dec. 1988).

Primary Examiner—David C. Nelms
Assistant Examiner—Khaled Shami
Attorney, Agent, or Firm—Fitzpatrick, Cella, Harper & Scinto

[57] ABSTRACT

Disclosed is a position detecting apparatus for detecting a relative position of two objects which are relatively moved. The apparatus includes a probe, a probe driving device, a position detecting device and an object driving device. The probe is provided for the first of the two objects so as to face the surface of the second of the two objects, so as to read information from the surface of the second object. The probe driving device allows the probe to two-dimensionally scan the surface of the second object so that the probe reads the two-dimensional information from the surface of the second object. The position detecting device detects a relative positional relation of the two objects by comparing the two-dimensional information obtained by the two-dimensional scan of the probe by the probe driving device with reference to two-dimensional information. The object driving device executes the relative positioning of the two objects on the basis of the result of the detection of the position detecting device.

40 Claims, 5 Drawing Sheets

TWO-DIMENSIONAL SCANNING DEVICE FOR DETECTING POSITION BETWEEN TWO RELATIVELY MOVABLE OBJECTS

This application is a continuation of prior application, Ser. No. 07/524,490 filed May 17, 1990, now abandoned.

BACKGROUND OF THE INVENTION

The present invention relates to a position detecting apparatus for use in the fine positioning, dimension measurement, distance measurement, position information measurement of a velocity, an instrumentation, and the like and, more particularly, to a position detecting apparatus for use in measurement control which requires a resolution of the atomic order (0.1 nanometer).

Particularly, the invention is suitable for use in a high accuracy positioning apparatus for positioning or the like of a wafer in an ultradine working on the order of a nanometer such as in drawing or the like of a super LSI wafer pattern.

An encoder which can be mentioned as one of such a kind of conventional position detecting apparatuses is constructed by a reference scale having information regarding position or angle and detecting means which moves relatively with respect to the reference scale and detects information regarding the position or angle. Such an encoder is classified into several types depending on the reference scale and the detecting means. For instance, an optical type encoder, a magnetic type encoder, an electrostatic capacitive encoder, and the like have been known.

On the other hand, hitherto, in a positioning apparatus for positioning between a mask and a wafer, between a working beam head and a wafer, or the like in the ultrafine working, after the coarse positioning operations of two or three steps were executed, the fine positioning is performed. Among the position detecting apparatuses which are used in those positioning techniques, as apparatuses having a high resolution, there have been known an apparatus in which a laser beam or an electron beam is irradiated onto a positioning mark provided on the surface of a wafer and an edge of a stairway-like portion of the positioning mark is detected by the diffused lights or diffused secondary electrons and an apparatus in which a shape of a positioning mark is formed like a diffraction grating or a zone plate and a change in intensity of the reflected interference light or a positional deviation of a focused beam spot is detected.

However, in the above conventional examples, the performance (resolution) of the lattice interference optical type encoder having the highest resolution among the apparatuses which have already been put into practical use is mainly determined by a lattice pitch. An important point is how the lattice pitch is formed at fine intervals at a high accuracy and is detected at a high precision. According to the present fine working technique (for instance, in electron beam drawing or ion beam working), there is a limitation of up to ten nanometers with respect to accuracy. On the other hand, even in the detecting technique (for example, in the optical heterodyne method), there is a limitation of ten nanometers as a resolution. Therefore, when an encoder of a higher resolution is needed for a semiconductor manufacturing apparatus or the like, such a requirement cannot be satisfied.

Among the above conventional examples, in the apparatus in which the edge of the positioning mark is detected by a laser beam or an electron beam, the positioning accuracy is limited due to a focusing diameter of the laser beam or electron beam. Further, a positional detection error also easily occurs even by a defective mark or an aberration or a breakage of the mark which is caused during the working process. On the other hand, in the apparatus in which an intensity of interference light or a positional deviation of a focused beam spot is detected from the positioning mark of a diffraction grating or zone plate, the position detection accuracy is limited by a manufacturing accuracy of the mark. Therefore, even in those positioning techniques of a high resolution, there is a limitation of 0.1 micrometer as a positioning accuracy. A further higher accuracy is needed in the positioning of a wafer in the drawing or the like of a super LSI wafer pattern which is being made even finer.

On the other hand, as another conventional example, in JP-A-62-209302, there has been disclosed a parallel movement quantity detecting apparatus in which a parallel movement quantity of a stage or the like is detected by a resolution of the atomic order.

According to such a detecting apparatus, in a parallel moving apparatus of an x-y stage, an electrode needle and a monocrystal whose atom interval has already been known are respectively fixed to a fixing portion and a movable portion, the number of atoms passed is counted based on a change in potential which occurs by charges which move between them when the electrode needle passes over the atoms, and a parallel movement quantity is detected from the count value of the number of atoms and the interval between atoms.

However, even in the parallel movement quantity detecting apparatus disclosed in JP-A-62-209302, errors also occur due to a local defect of the monocrystal, errors and vibration, or a disturbance such as a temperature drift or the like. Further, since the monocrystal having a two-dimensional atom arrangement is used and the same signals are generated by the movements in the directions of x and y, a two-dimensional movement quantity is obtained by individually detecting the movement quantities in the two directions of x and y. Therefore, since parallel movement quantity drive signals in the two x and y directions are preliminarily needed, such a principle cannot be directly applied to the encoder.

An apparatus which can solve the above problems is discussed in the literature (H. Kawakatsu and T. Higuchi, SEISAN KENKYU, Vol. 40, No. 12, pages 609–611). According to such an apparatus, a probe fixed under a positioning table is two-dimensionally moved every table, opposite crystal structures are two-dimensionally scanned, a pattern matching is executed by a two-dimensional STM image obtained, and the position of the probe (namely, the position of the table) is calculated.

However, according to the structure of the apparatus, the table also must be moved for the period of time when the probe is two-dimensionally scanned to obtain a two-dimensional image, so that there is a drawback such that, for instance, in the case when work piece is put on the table, the working operation must be interrupted during the two-dimensional scanning of the probe.

As related background art by the applicant of the present invention, in EPO 304893A2 (U.S. patent application No. 235,552), there has been disclosed a recording and reproducing apparatus in which position information or the like of a pattern which is at present being detected is obtained from a signal obtained by scanning by a probe a region in which a pattern having position information or the like was formed and the probe is moved to a recording region on the basis of the position information. According to the position detection in the above apparatus, one pattern is first detected only once upon one positioning operation and the positioning is executed on the basis of the information detected. Therefore, such a position detecting method differs from that of the type in which a pattern in the same region is detected and the position is detected in a real-time manner on the basis of a change in detection information of the detected pattern from a reference pattern, which type is an object of the present invention and will be explained hereinafter.

SUMMARY OF THE INVENTION

In consideration of the drawbacks of the conventional examples mentioned above, it is the first object of the invention to provide a position detecting apparatus in which a resolution of the atomic order is obtained, the moving direction can be easily discriminated, and even if an object whose position is to be detected is, for instance, fixed, the position also can be detected in a real-time manner.

The above and other objects and features of the present invention will become apparent from the following detailed description and the appended claims with reference to the accompanying drawings.

DETAILED DESCRIPTION OF THE PREFERRED EMBODIMENTS

To accomplish the above object, a position detecting apparatus of an embodiment, which will be explained hereinafter, comprises: a reference object having a conductive two-dimensional surface which is fixed to a first object; a conductive probe arranged on a second object in a manner such that a tip approaches a two-dimensional surface of the reference object; probe moving means for relatively two-dimensionally moving the probe along the two-dimensional surface of the reference object; power supplying means for applying a voltage between the reference object and the probe and causing a tunnel current; signal detecting means for detecting the tunnel current signal which is generated by the voltage supply; means for obtaining data of a two-dimensional surface image of the reference object on the basis of the tunnel current which is detected by the signal detecting means upon movement by the probe moving means; and means for detecting a relative displacement quantity between the first and second objects which is caused between two two-dimensional surface images obtained at different timings by the above means on the basis of data of those two two-dimensional surface images.

The means of obtaining the data of the two-dimensional surface images has, for instance, means for controlling a distance between the two-dimensional surface of the reference object and the probe. The distance control means controls the distance between the reference object and the probe in a manner such that upon movement of the probe by the probe moving means, the tunnel current flowing between the reference object and the probe is made constant. The means for obtaining the data of the two-dimensional surface images obtains the data of the two-dimensional surface image of the reference object from a control quantity in the distance control means. Alternatively it is possible to construct the device in a manner such that the distance between the reference object and the probe is set to a predetermined value and the data of the two-dimensional surface image is directly obtained from a change in tunnel current flowing between them.

In the above construction, the principle of a scanning tunneling microscope (hereinafter, referred to as an STM) is applied. According to the STM, a voltage is applied between the conductive probe which was made to approach until a distance of about 1 nanometer and a conductive material and a tunnel current flowing therebetween is detected, so that various information regarding the shape of the surface of the conductive material and an electron distribution state can be obtained at a lateral resolution of 0.1 nanometer and at a vertical resolution of 0.01 nanometer [G Binning et al., Phys., Rev., Lett., 49 (1982) 57]. According to the invention, when the above principle is applied, a tunnel current is allowed to flow by applying a voltage between a reference object and a probe which are provided for first and second objects which cause a relative change, and at the same time, a predetermined range on the two-dimensional surface of the reference object is two-dimensionally scanned by the probe, a tunnel current at each point on the two-dimensional region is detected, and a roughness distribution of the two-dimensional surface near the tip of the probe is obtained as two-dimensional image data. The image data is derived at a predetermined time interval. Assuming that a relative displacement occurred between the first and second objects for such a time interval, such a relative displacement appears as a positional deviation between the image data. A relative displacement amount between the first and second objects is detected from a positional shift quantity between the two-dimensional image data.

According to the above method, since the roughness information of the two-dimensional surface of the reference object is used as a reference to detect the relative deviation quantity, a more stable detection with less errors is executed for a local defect of the two-dimensional surface of the reference object, errors and vibration, or a disturbance such as temperature drift or the like. On the other hand, since the principle of the STM is applied, the relative displacement quantity is detected at a resolution of 0.1 nanometer.

A positioning apparatus of an embodiment, which will be explained hereinafter, comprises: a positioning mark having a conductivity which is fixed to either one of an object to which a working section (a working head in an embodiment, which will be explained hereinafter) is fixed and a work piece which can relatively move as the object; a conductive probe which is fixed to the other one of the object and the work piece and is arranged in a manner such that a tip is located near the positioning mark; scanning means for scanning the positioning mark by the conductive probe; voltage applying means for applying a voltage between the positioning mark and the conductive probe; current detecting means for detecting a value of a tunnel current flowing between the positioning mark and the conductive probe upon scanning by the scanning means; shift quantity detecting means for detecting a positional shift quantity of a two-dimensional image of the positioning mark which is obtained on the basis of the tunnel current value detected by the current detecting means; and driving means for executing a relative movement between the working section and the work piece on the basis of a shift quantity signal from the shift quantity detecting means, wherein the scan of the positioning mark by the probe, the detection of the positional shift quantity, and the relative movement between two objects are executed in parallel with the operation of the working section.

For instance, there is provided distance control means for controlling the distance between the positioning mark and the conductive probe in a manner such that a tunnel current flowing therebetween is set to a predetermined value, and a two-dimensional image of the positioning mark can be obtained from a change amount of the distance between the positioning mark and the probe.

Generally, the positioning mark is formed as a roughness shape of one of the surfaces of the object to which the working section is fixed and the work piece. However, as another method, by providing means for applying a pulse voltage between one of the surfaces having the conductivity and the conductive probe fixed to the other surface and by applying a pulse voltage by the voltage applying means, a roughness shape also can be formed on the surface having the conductivity. Ordinarily, the positioning mark is formed on the surface on the side opposite to the working surface of the work piece.

Further, generally, the apparatus includes means for coarsely positioning the working section and the work piece.

In the above construction, the positioning method using the tunnel current as mentioned above is used.

In the embodiment, there are provided the probe and the positioning mark which are arranged so as to closely face two objects in which the relative positioning is needed, a tunnel current is allowed to flow by applying a voltage between the probe and the positioning mark, and at the same time, the positioning mark is two-dimensionally scanned by the probe, so that a tunnel current is derived. A relative positional relation (positional shift quantity) between the probe and the positioning mark is detected from such a tunnel current or from a two-dimensional image of a control signal when the tunnel current was set to a predetermined value. Thus, the positioning between the two objects which need the relative positioning is executed at a resolution and an accuracy of 0.1 nanometer. Further, since the positioning mark is closely formed on the back surface of the positioning position of the positioning object, the positioning is executed without any positional error due to influence by a temperature distortion or damage of a mark during the process.

Therefore, when the working section works the other object such as a wafer or the like by a laser beam or an electron beam, a positional shift between the working section and the other object is always detected by the shift quantity detecting means during a working operation, and such a shift is corrected by the driving means. Thus, the working is executed while keeping the initial set position at a high accuracy. On the other hand, even in a case when after the wafer and the like were removed and the processes such as etching and the like were executed, the working by the working section is again executed, by using the initial set position as a reference of the positional shift quantity which is detected by the shift quantity detecting means, the positioning is performed to the initial set position at a high accuracy.

As mentioned above, the positioning of the position fixing, position recovery, position movement, and the like having a resolution and an accuracy of 0.1 nanometer is executed by the positioning method using the tunnel current, so that the working is executed by the working section at a high precision.

An embodiment of the invention will be described hereinbelow with reference to the drawings.

First embodiment

Figure 1:
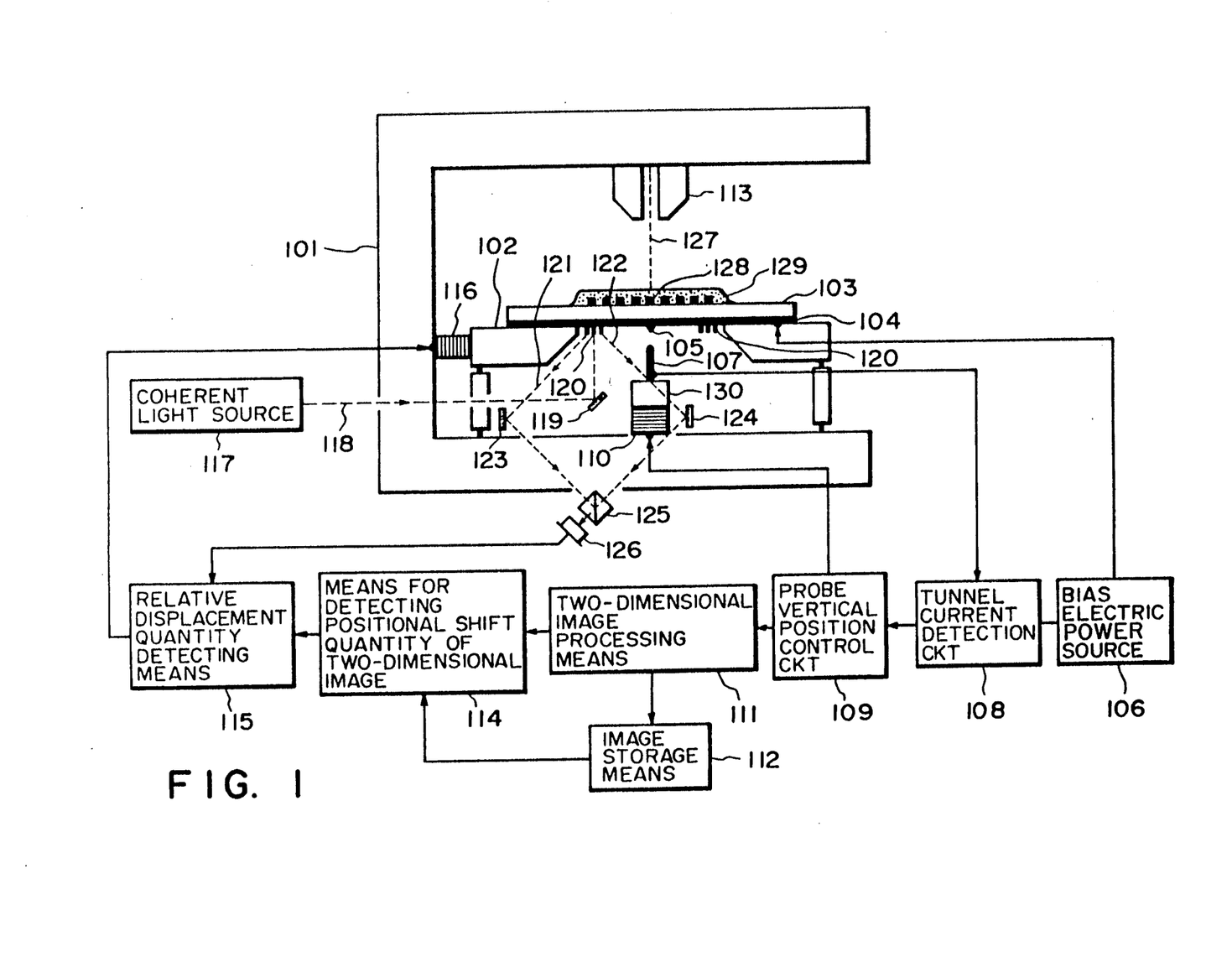
FIG. 1 is a constructional diagram of a positioning apparatus to which a relative position detection using a tunnel current according to the first embodiment of the invention is applied.
Figure 2:
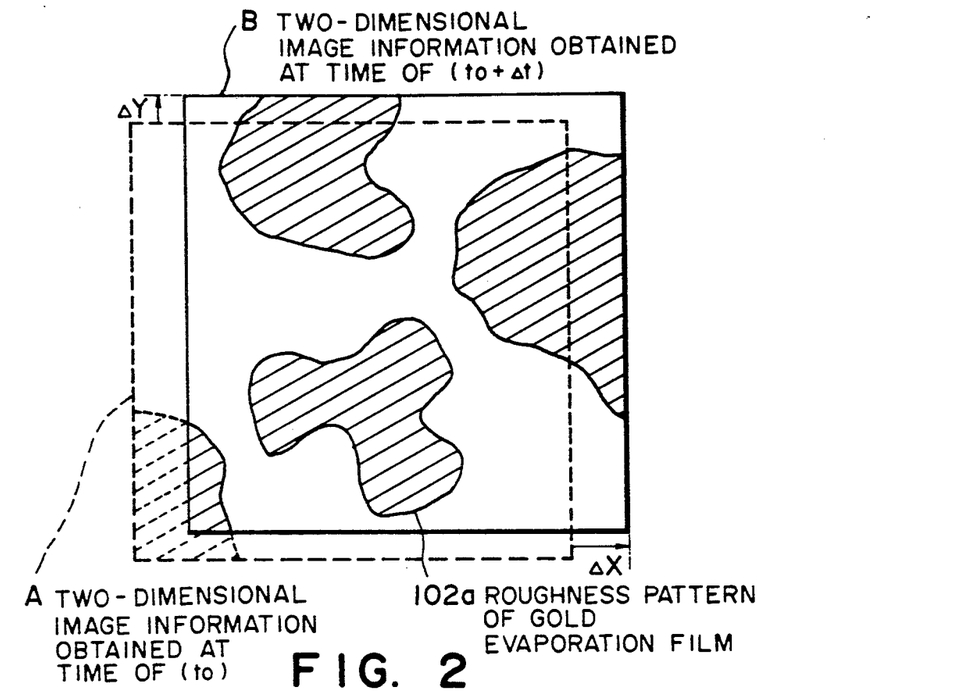
FIG. 2 is a schematic diagram showing a two-dimensional image of a fine positioning mark of a roughness pattern of a gold evaporation film in the two-dimensional image positional shift detecting means in FIG. 1.

FIG. 1 is a constructional diagram of a positioning apparatus according to the first embodiment of the invention. FIG. 2 shows an example of a minute positioning two-dimensional image in a case when a minute roughness pattern of a gold evaporation film was used as a minute positioning mark in the apparatus of FIG. 1. As shown in FIG. 1, in the apparatus, a gold evaporation film 104 having a film thickness of about 20 nanometers is formed on the back surface of a work piece 103 such as a wafer or the like fixed to a stage 102 which is movable for a fixing member 101. A fine roughness pattern on the surface of the gold evaporation film 104 constructs a fine positioning mark 105. The mark 105 also can be formed on the back surface of the stage 102. A bias voltage is applied to the film 104 by a bias electric power source 106. A tunnel current flowing between the film 104 and a probe 107 having a conductivity which is arranged so as to face the fine positioning mark 105 and is allowed to approach until a distance of one nanometer or less is detected by a tunnel current detection circuit 108. The interval between the probe 107 and the mark 105 is controlled by a probe vertical position control circuit 109 and probe vertical position control means 110 in a manner such that a value of the detected tunnel current is set to a predetermined value (for example, one nanoampere), that is, the distance between the probe 107 and the mark 105 is set to a predetermined value. Therefore, the mark 105 is two-dimensionally scanned in the lateral direction (the direction parallel to the surface of the film 104) by the probe 107 by two-dimensional scanning means 130. A probe vertical position control signal from the probe vertical position control circuit 109 at each point on the scanning region is monitored by two-dimensional image processing means 111. Due to this, the fine positioning mark 105, namely, a two-dimensional distribution image of the fine roughness pattern on the gold evaporation film surface is obtained and sequentially stored into image storing means 112.

If a relative displacement of the stage 102 occurs for the fixing member 101, that is, when relative displacements occurred among a working head 113 and probe 107 fixed to the fixing member 101 and the work piece 103 fixed to the stage 102, time-dependent lateral shifts occur in a two-dimensional distribution image of a fine roughness pattern 102a on the gold evaporation film surface which is obtained by the two-dimensional image processing means 111. In the example shown in FIG. 2, lateral shifts of $\Delta X$ and $\Delta Y$ occur between two-dimensional image information A and B derived at times $t_0$ and $t_0 + \Delta t$. In two-dimensional image positional shift quantity detecting means 114, there are detected two-dimensional lateral shift quantities $\Delta X$ and $\Delta Y$ between the two-dimensional image information obtained at time $t_0 + \Delta t$ from the two-dimensional image processing means 111 and the two-dimensional image information obtained at time $t_0$ from the image storage means 112. Further, in relative displacement quantity detecting means 115, a coarse movement quantity detection signal from a light quantity detecting device 126 is added to a fine movement quantity detection signal. In accordance with an output of the relative displacement quantity detecting means 115, stage driving means 116 drives the stage 102 so that the relative position between the work piece 103 and the working head 113 (that is, between the fine positioning mark 105 and the probe 107) is set to a predetermined value.

A coarse movement quantity detection of the relative displacement quantity between the mark 105 and the probe 107 is executed, for instance, in the following manner. That is, a coherent light 118 from a coherent light source 117 is caused to be incident by a mirror 119 onto a coarse positioning mark 120 comprising a diffraction grating provided on the gold evaporation film 104 formed on the back surface of the work piece 103. Thus, ±nth order diffracted lights 121 and 122 are obtained. The diffracted lights 121 and 122 are reflected by mirrors 123 and 124. Thereafter, the reflected lights are input to a beam mixer 125. Thus, the two diffracted lights are synthesized by the beam mixer 125 and input as an interference light to the light quantity detecting device 126. At this time, assuming that a bright/dark intensity change occurred in the interference light which enters the light quantity detecting device 126 due to the relative displacement in the lateral direction between the work piece 103 and the probe 107 and, for instance, assuming that the relative displacement quantity is equal to one pitch of the diffraction grating, in the case of interfering the first order diffracted lights, a bright/dark change corresponding to two periods occurs. Therefore, from the above relation, in the relative displacement quantity detecting means 115, the coarse movement quantity can be obtained on the basis of an output of the light quantity detecting device 126.

The position controlling operation of the work piece 103 when the work piece 103 is worked will now be described.

First, after the work piece 103 such as a wafer or the like which is not yet worked was set onto the stage 102, when it is first worked by a working beam 127 from the working head 113 (at the first stage, there is no need to execute a fine positioning), the relative positional relation between the fine positioning mark 105 and the probe 107 at the set position is previously stored into the image storage means 112 as a two-dimensional distribution image of a fine roughness pattern on the surface of the gold evaporation film at the position of the tip of the probe 107 by the above method. During the first working operation, the position of the stage 102 is controlled as mentioned above so as not to cause a positional shift between the working beam 127 and a working portion 128 on the work piece 103, that is, so as not to cause a lateral shift from the two-dimensional distribution image of the roughness pattern which was first stored due to a temperature drift by the heat generation or convection during the working process, an external vibration, a relaxation of a movable mechanical portion, or the like. At this time, the two-dimensional scanning means 130 allows the probe 107 to two-dimensionally scan the mark 105 by moving the probe 107 for the fixing member 101 and to execute the two-dimensional scan of the probe 107 irrespective of the driving state of the stage driving means 116. Therefore, even in a case when the work piece 103 and the fixing member 101 are held in a fixed relation during the working operation, the mark can be detected in a real-time manner, so that the real-time position control can be performed.

After an image pattern was drawn onto a resist 129 or the like on the work piece 103 by the working beam 127 while executing the position control as mentioned above, the work piece 103 is removed from the stage 102 and the processes such as etching and the like are executed. The work piece 103 is again fixed to the stage 102 and the position when the work piece 103 is first worked is recovered for the working beam 127. After that, the next working operation is performed. At this time, the next working position is recovered in the following manner.

First, the position of the stage 102 is recovered in the positioning range in the fine positioning method by the coarse positioning method using the coherent light 118. Thereafter, a lateral shift quantity between the two-dimensional distribution image of the roughness pattern stored at the time of the first working operation and the two-dimensional distribution image of the roughness pattern which is obtained at the present position is derived. The position of the stage 102 is controlled so that the lateral shift quantity is set to zero.

When the second and subsequent working operations are executed after the position at the time of the first working operation was recovered as mentioned above, the lateral shift quantity between the two-dimensional distribution image of the roughness pattern which has previously been stored upon the first working and the two-dimensional distribution image of the roughness pattern which is obtained by each of the second and subsequent working operations or a sequential movement quantity during the working operation is compared with a set value. A desired drawing pattern is worked while controlling the position of the stage 102.

According to the embodiment, the fine positioning mark 105 has been formed at the position on the work piece 103 where the surface (back surface of the work piece 103) on the side opposite to the working portion 128 by the working beam 127 and the extension line of the working beam 127 cross. Therefore, the relative positional shift quantity in the lateral direction between the working portion 128 and the mark 105 due to the temperature distortion of the work piece 103 further decreases. On the other hand, a plurality of coarse positioning marks 120 have been provided at the symmetrical positions for the fine positioning mark 105 and the coarse positioning operations have been executed with respect to the marks 120, respectively. Therefore, the relative positional shift quantity in the lateral direction between the working portion 128 and the fine positioning mark 105 due to the temperature distortion of the work piece 103 can be cancelled at the level of the coarse positioning accuracy. Further, since the fine positioning mark 105 and coarse positioning mark 120 have been provided on the side (back surface of the work piece 103) opposite to the working portion 128 of the work piece 103, damage to the marks during the working processes such as beam image drawing, etching, and the like can be prevented.

Second embodiment

Figure 3:
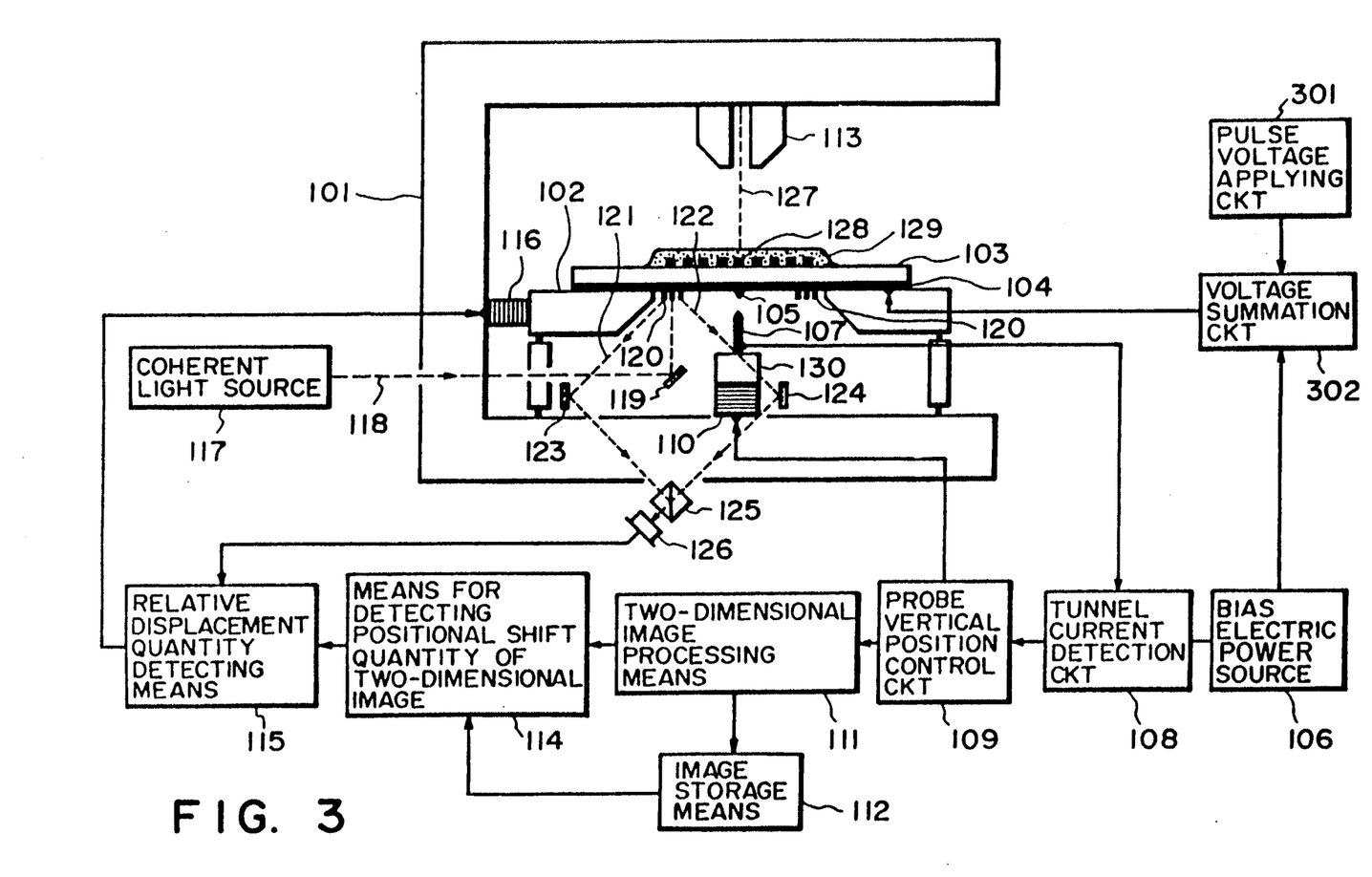
FIG. 3 is a constructional diagram of a positioning apparatus to which a relative position detection using a tunnel current according to the second embodiment of the invention is applied.
Figure 4:
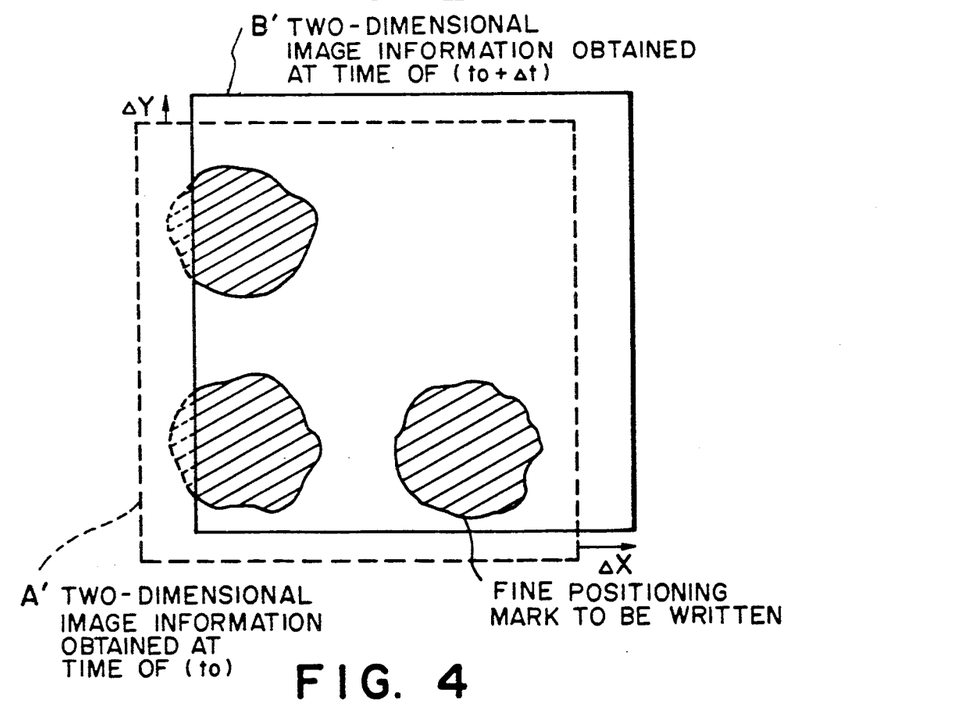
FIG. 4 is a schematic diagram showing a two-dimensional image of a fine positioning mark written on a gold evaporation film in the two-dimensional image positional shift detecting means in FIG. 2.

FIG. 3 is a constructional diagram of a positioning apparatus according to the second embodiment of the invention. FIG. 4 shows an example of a minute positioning two-dimensional image in a case when a minute positioning mark written on a gold evaporation film was used in the apparatus of FIG. 3.

As shown in FIG. 3, in the apparatus, the interval between the probe 107 and the gold evaporation film 104 is controlled by a similar operation by a construction similar to that in the first embodiment mentioned above.

However, in the second embodiment, a pulse voltage of a pulse width of $10^{-5}$ seconds and a voltage of 10 volts is applied between the gold evaporation film 104 and the probe 107 by a pulse voltage applying circuit 301 and a voltage summation circuit 302, thereby writing the fine positioning mark 105 onto the film 104. The second embodiment differs from the first embodiment with respect to only the above point.

On the other hand, the position control in the lateral direction of the stage 102 is also executed in a manner similar to the first embodiment. In the second embodiment, examples of the lateral shifts $\Delta X$ and $\Delta Y$ between image information A' and B' at times $t_0$ and $t_0 + \Delta t$ are as shown in FIG. 4.

When the work piece 103 is worked, after the work piece 103 such as a wafer or the like which is not yet worked was set onto the stage 102, the fine positioning mark 105 is written at such a set position. After that, the work piece is worked while controlling the position of the stage 102 in substantially the same manner as the first embodiment.

According to the two embodiments explained above, the probe and the positioning mark are provided for two objects which require the relative positioning so as to position them closely. A voltage is applied and a tunnel current is caused to flow between the probe and the positioning mark. The positioning mark is two-dimensionally scanned by the probe. Thus, a relative positional relation (positional shift quantity) between the probe and the positioning mark is detected from a two-dimensional image corresponding to the tunnel current change which is derived by the two-dimensional scan of the positioning mark or the control signal change to make the tunnel current constant, thereby controlling the relative position between the two objects. Therefore, the positioning in the position fixing operation between two objects, position recovery, position movement, and the like can be accomplished at a resolution and an accuracy of 0.1 nanometer. Further, by closely providing the positioning mark to the back surface at the positioning location of the object to be positioned, a positioning error due to an influence by the temperature distortion or a damage of the mark during the processing can be prevented.

Further, the means for allowing the probe to two-dimensionally scan moves the probe for the fixing member to which the probe is arranged, thereby causing the probe to two-dimensionally scan on a work piece. Therefore, the two-dimensional scan by the probe can be executed almost independently of the relative positional relation between the fixing member and the work piece. Thus, even during the working in which the fixing member side and the work piece side must be set to the almost fixed relation, the relative position detection by the two-dimensional scan of the probe can be executed in a real-time manner.

Third embodiment

Figure 5:
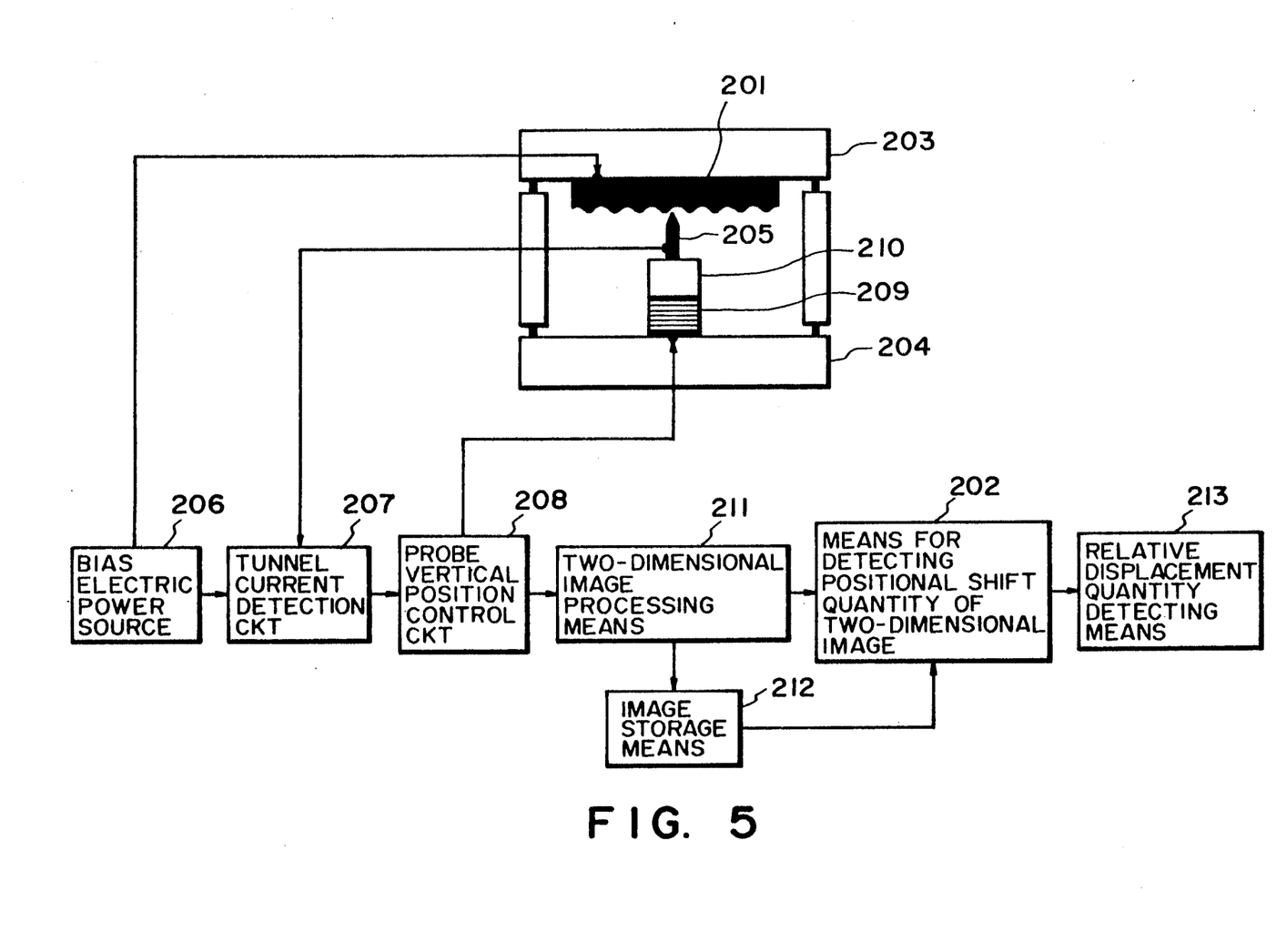
FIG. 5 is a constructional diagram of an encoder by a tunnel current detection using a two-dimensional reference scale according to the third embodiment of the invention.
Figure 6:
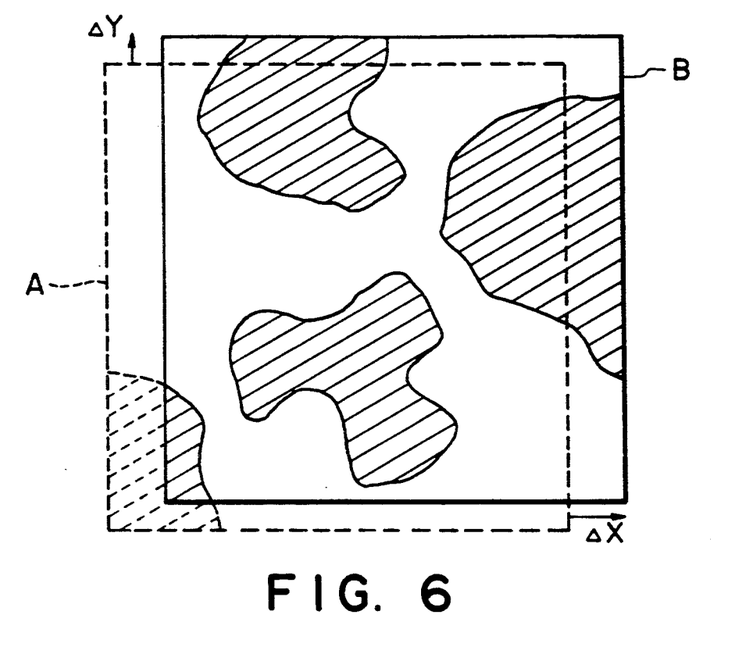
FIG. 6 is a schematic diagram showing a two-dimensional image of a two-dimensional reference scale by a roughness pattern of a gold evaporation film which is used in the apparatus of FIG. 5.
Figure 7:
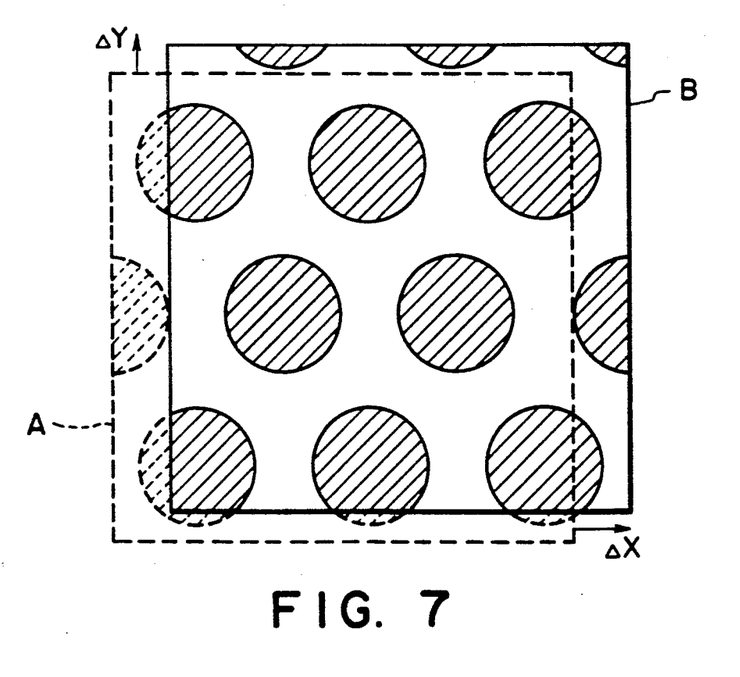
FIG. 7 is a schematic diagram showing a two-dimensional image of a two-dimensional reference scale by a conductive crystal cleavage plane atom lattice which is used in the apparatus of FIG. 5.

FIG. 5 shows a construction of an encoder according to the third embodiment of the invention. As a two-dimensional reference scale 201 of the encoder, FIGS. 6 and 7 show a fine roughness pattern of a gold evaporation film and a two-dimensional image in means 202 for detecting a positional shift quantity of a two-dimensional image in the case of using an atom lattice of a conductive crystal cleavage plane, respectively. In the encoder of FIG. 5, objects 203 and 204 are set such that a relative displacement can occur in the lateral direction (the right and left directions in the drawing). A probe 205 having a conductivity is provided for the object 204. The conductive two-dimensional reference scale 201 is provided for the object 203. The probe 205 is arranged so as to face the scale 201 and is allowed to approach until a distance of one nanometer or less is achieved. A bias voltage is applied between the probe 205 and the scale 201 by a bias electric power source 206. A tunnel current flowing between them is detected by a tunnel current detection circuit 207. The inverval between the probe 205 and the two-dimensional reference scale 201 is controlled by a probe vertical position control circuit 208 and probe vertical position control means 209 in a manner such that the detected tunnel current value is set to a predetermined value (for instance, one nanoampere), that is, the distance between the probe 205 and the two-dimensional reference scale 201 becomes constant. A probe vertical position control signal from the probe vertical position control circuit 208 at each point on the two-dimensional plane is monitored by two-dimensional image processing means 211. Therefore, when two-dimensional scanning means 210 allows the probe 205 to two-dimensionally scan the two-dimensional reference scale 201 in the lateral direction, a two-dimensional roughness distribution image of the scale 201 is obtained as an output of the image processing means 211 and sequentially stored into image storage means 212. When a relative displacement between the objects 203 and 204 occurs, that is, when a relative displacement occurs between the probe 205 fixed to the object 204 and the two-dimensional reference scale 201 fixed to the object 203, a time-dependent lateral shift occurs in the two-dimensional roughness distribution image of the reference scale 201 obtained by the image processing means 211. FIGS. 6 and 7 show examples in a case when lateral shifts of ΔX and ΔY occurred between the two-dimensional image information A and B derived at times $t_0$ and $t_0+\Delta t$, respectively.

In the two-dimensional image positional shift quantity detecting means 202, the two-dimensional lateral shift quantities ΔX and ΔY between the two-dimensional image information obtained at time $t_0+\Delta t$ from the two-dimensional image processing means 211 and the two-dimensional image information derived at time $t_0$ from the image storage means 212 are detected. In relative displacement quantity detecting means 213, a two-dimensional relative displacement quantity between the actual objects 203 and 204 is detected from the lateral shift quantities ΔX and ΔY and the two-dimensional scan quantity of the probe 205 by the two-dimensional scanning means 210. In the case when the two-dimensional scale having no regularity such as a fine roughness pattern on the gold evaporation film as shown in FIG. 6 is used as the two-dimensional reference scale 201, it is necessary to predetermine a two-dimensional scanning range of the probe 205 for the reference scale 201. An actual lateral shift quantity can be obtained from a lateral shift ratio of the two-dimensional image in such a known two-dimensional scanning range. On the other hand, in the case when a scale having a regularity such as an atom lattice of a conductive crystal cleavage plane as shown in FIG. 7 is used as the reference scale 201, the period of the atom lattice can be used as a reference. Therefore, the lateral shift quantity can be obtained by using one period of the lattice as a unit.

According to the third embodiment described above, in the encoder for detecting a relative movement quantity between two objects, the principle of the scanning tunneling microscope is used, the positional relation between the probe and the reference object is obtained as a two-dimensional image of the roughness distribution of the reference object near the tip of the probe, and a time-dependent lateral shift quantity of the two-dimensional image which is caused by the relative displacement between the two objects is detected. Therefore, the resolution of the detection of the relative displacement quantity can be set to 0.1 nanometer. Also, the stable detection can be executed for a local defect of the reference object, errors and vibration, or a disturbance such as a temperature drift or the like.

On the other hand, by moving the probe for an object provided with the probe, the two-dimensional reference scale is two-dimensionally scanned by the probe. Therefore, the relative position can be detected in a real-time manner by the two-dimensional scan of the probe irrespective of the relative moving state between two objects which can be relatively moved.

What is claimed is:

1. An apparatus for executing relative positioning of two, relatively movable objects, said apparatus comprising:

a probe for obtaining a signal from the surface of a first one of the two objects, said probe being provided on the second of the two objects so as to face the surface of the first of the two objects, said probe providing a reference, and two-dimensional information regarding the surface of the first of the two objects being obtained from a signal variation in response to two-dimensional relative movement of the surface of the first of the two objects and the reference in the surface direction;

probe driving means for two-dimensionally scanning the surface of the first of the two objects by said probe, said probe driving means causing the reference to displace relative to the second object to effect two-dimensional scanning by said probe;

position detecting means for detecting a relative positional relation of the two objects by comparing the two-dimensional information obtained by said probe during the two-dimensional scan by said probe driving means with reference two-dimensional information; and object driving means for executing the relative positioning of the two objects on the basis of the result of the detection by said position detecting means.

2. An apparatus according to claim 1, wherein a two-dimensional distribution image of a fine roughness pattern on the surface of the first object is read by the two-dimensional scan of said probe.

3. An apparatus according to claim 2, wherein said position detecting means detects a relative movement quantity between the two objects based on a shift quantity of the two-dimensional distribution image of the fine roughness pattern on the surface of the first object read by each of a plurality of two-dimensional scans by said probe.

4. An apparatus according to claim 1, further comprising a conductive material in the surface portion of the first object, and wherein a surface state of the conductive material is read as two-dimensional information by said probe.

5. An apparatus according to claim 1, further comprising coarse position detecting means for coarsely detecting the relative position between the two objects, and wherein said object driving means coarsely positions the two objects on the basis of the result of the detection by said coarse position detecting means.

6. An apparatus according to claim 5, wherein said coarse position detecting means comprises:

a diffraction grating provided on the first object;

a light source for irradiating the diffraction grating with light;

an interference optical system for allowing interference of diffracted light from the diffraction grating irradiated with the light;

a detector for detecting interference light from the interference optical system; and relative displacement quantity detecting means for detecting a relative displacement quantity between the two objects on the basis of the result of the detection by said detector.

7. An apparatus according to claim 1, further comprising mark forming means for forming a position detecting mark onto the first object, and wherein said probe two-dimensionally scans a region including the position detecting mark formed by the mark forming means, thereby reading information regarding the position detecting mark, and said position detecting means detecting the relative positional relation between the two objects based on the information from the position detecting mark.

8. A processing apparatus for processing a work piece, said apparatus comprising:

a first member;

a stage for holding the work piece, said stage being movable relative to said first member;

processing means, arranged on said first member, for processing the work piece held by said stage;

a probe for obtaining a signal from a surface of one of said first member and an arrangement comprising said stage and the work piece held on said stage, said probe being provided on the other one of the arrangement and said first member so as to face the surface of one of the arrangement and said first member, said probe providing a reference, and two-dimensional information regarding the surface of one of the arrangement and said first member being obtained from a signal variation in response to two-dimensional relative movement of the reference and the surface of one of the arrangement and said first member in the surface direction;

probe driving means for two-dimensionally scanning the surface of one of the arrangement and said first member by said probe, said probe driving means causing the reference to displace relative to the other one of the arrangement and said first member to effect the two-dimensional scanning by said probe;

position detecting means for detecting a relative positional relation between the arrangement and said probe by comparing the two-dimensional information obtained by said probe during the two-dimensional scan by said probe driving means with reference two-dimensional information; and stage driving means for relatively driving the stage relative to the first member to execute the relative positioning between said processing means and the work piece on the basis of the result of the detection by said position detecting means.

9. An apparatus according to claim 8, wherein said probe driving means causes said probe to two-dimensionally scan during the processing of the work piece by said processing means.

10. An apparatus according to claim 9, wherein said stage driving means drives the stage to execute the relative positioning between said processing means and the work piece on the basis of the result of the detection by said position detecting means which detects the relative positional relation on the basis of the information obtained from said probe which two-dimensionally scans during the processing of the work piece by said processing means.

11. An apparatus according to claim 10, wherein said stage driving means drives the stage so as not to cause a positional shift between said processing means and the work piece during the processing of the work piece by said processing means.

12. An apparatus according to claim 8, wherein said probe is arranged with respect to the first member so as to face the back surface of the work piece held by said stage.

13. An apparatus according to claim 12, wherein said processing means executes the processing by irradiating a processing beam to the work piece and said probe two-dimensionally scans a portion near the position where an extension of the processing beam and the back surface of the work piece intersect.

14. An apparatus according to claim 13, further comprising coarse position detecting means for coarsely detecting the relative position between the first member and the work piece, and wherein said stage driving means coarsely positions said processing means and the work piece on the basis of the result of the detection of by said coarse position detecting means.

15. An apparatus according to claim 14, further comprising:

a diffraction grating provided on the back surface of the work piece;

a light source for irradiating the diffraction grating with light;

an interference optical system for allowing interference of diffracted light from the diffraction grating irradiated with the light;

a detector for detecting interference light from said interference optical system; and relative displacement quantity detecting means for detecting a relative displacement quantity between said processing means and the work piece on the basis of the result of the detection by said detector.

16. An apparatus according to claim 15, wherein a plurality of said diffraction gratings are provided at symmetrical positions with respect to a portion near the position where the extension of the processing beam and the back surface of the work piece intersect.

17. An apparatus according to claim 14, wherein said probe obtains information by executing a first two-dimensional scan during a first processing of the work piece by said processing means, said stage driving means executing the coarse positioning between said processing means and the work piece subjected to another process after completion of the first processing on the basis of the result of the detection by said coarse position detection means, said probe obtaining information by executing a second two-dimensional scan on the back surface of the work piece which was coarsely positioned, said position detecting means detecting a relative positionl relation between said processing means and the work piece from at least the information obtained by the first and second two-dimensional scans, and said stage driving means executing the relative positioning between said processing means and the work piece based on the result of the detection by said position detecting means.

18. An apparatus according to claim 8, further comprising mark forming means for forming a position detecting mark onto the one surface, and wherein said probe reads information regarding the position detecting mark by two-dimensionally scanning a region including the position detecting mark formed by the mark forming means, and said position detecting means detects a relative positional relation between the arrangement and said probe based on the information from the position detecting mark.

19. An apparatus for executing relative positioning between two, relatively movable objects, said apparatus comprising:

a probe for obtaining a signal from the surface of a first one of the two objects, said probe being provided on the second of the two objects so as to face the surface of the first one of the two objects, said probe providing a reference, and two-dimensional information regarding the surface of the first object being obtained from a signal variation in response to two-dimensional relative movement between the reference and the surface of the first object in the surface direction;

probe driving means for two-dimensionally scanning the surface of the first object by said probe, and for driving the reference to effect the two-dimensional scanning;

position detecting means for detecting a relative positional relation between the two objects by comparing the two-dimensional information obtained by said probe during the two-dimensional scan by said probe driving means with reference two-dimensional information; and object driving means for executing a relative driving of the two objects to relatively position the two objects on the basis of the result of the detection by said position detecting means, the relative driving of the two objects by said object driving means being effected independently from the driving of the reference by said probe driving means.

20. An apparatus according to claim 19, wherein a two-dimensional distribution image of a fine roughness pattern on the surface of the first of the two objects is read by the two-dimensional scan by said probe.

21. An apparatus according to claim 20, wherein said position detecting means detects a relative movement quantity between the two objects based on a shift quantity of the two-dimensional distribution image of the fine roughness pattern on the surface of the first object read by each of a plurality of two-dimensional scans by said probe.

22. An apparatus according to claim 19, further having means for applying a voltage between the probe and the surface of said one object, and wherein the two-dimensional information is read by detecting a tunnel current flowing between the surface of said one object and the probe to which the voltage was applied by the voltage applying means.

23. An apparatus for detecting relative position of two, relatively movable objects, said apparatus comprising:

a probe for obtaining a signal from the surface of a first one of the two objects, said probe being provided on the second of the two objects so as to face the surface of the first one of the two objects, said probe providing a reference, and two-dimensional information regarding the surface of the first object being obtained from a signal variation obtained in response to two-dimensional relative movement between the reference and the surface of the first object in the surface direction;

probe driving means for two-dimensionally scanning the surface of the first object by said probe, said probe driving means causing the reference to displace relative to the second object to effect the two-dimensional scanning by said probe; and position detecting means for detecting a relative positional relation between the two objects by comparing the two-dimensional information obtained from said probe by the two-dimensional scan by said probe driving means with reference two-dimensional information.

24. An apparatus according to claim 23, further comprising a two-dimensional reference scale formed on the surface of the first object, and wherein said probe reads the information from the two-dimensional reference scale.

25. An apparatus according to claim 24, wherein the two-dimensional reference scale comprises a conductive crystal cleavage plane.

26. An apparatus for detecting relative position of two, relatively movable objects, said apparatus comprising:

a probe for obtaining a signal from a predetermined portion of a first one of the two objects, said probe being provided on the second of the two objects so as to face the predetermined portion of the first of the two objects, said probe providing a reference, and two-dimensional information regarding said predetermined portion being obtained from a signal variation in response to two-dimensional relative movement between the reference and the predetermined portion in the surface direction of the predetermined portion;

two-dimensional moving means for two-dimensionally scanning the surface of the predetermined portion by said probe, said two-dimensional moving means causing the reference to move two-dimensionally relative to the predetermined portion to effect the two-dimensional scanning, the two-dimensional relative movement being effected independently from the presence or absence of the relative movement of the two objects; and detecting means for detecting a relative positional relation between the two objects by comparing the two-dimensional information of the predetermined portion read by said probe with reference two-dimensional information.

27. An apparatus according to claim 26, wherein said two-dimensional moving means comprises probe driving means for driving said probe to cause displacement of the second object, and wherein said probe driving means causes the relative two-dimensional movement between said probe and the predetermined portion irrespective of the presence or absence of the relative movement between the two objects.

28. An apparatus according to claim 1, wherein the reference provided by said probe is the tip of said probe.

29. An apparatus according to claim 8, wherein the reference provided by said probe is the tip of said probe.

30. An apparatus according to claim 19, wherein the reference provided by said probe is the tip of said probe.

31. An apparatus according to claim 23, wherein the reference provided by said probe is the tip of said probe.

32. An apparatus according to claim 26, wherein the reference provided by said probe is the tip of said probe.

33. An apparatus for executing a relative positioning of two, relatively movable objects, said apparatus comprising:

a probe provided on a first one of the two objects so as to face the surface of the second of the two objects, said probe for reading information from the surface of the second object;

voltage applying means for applying a voltage between said probe and the surface of the second object;

probe driving means for two-dimensionally scanning the surface of the second object with said probe, said probe reading two-dimensional information regarding the surface of the second object by the two-dimensional scan, the two-dimensional information being read by detecting a tunnel current flowing between the surface of the second object and said probe to which the voltage has been applied by said voltage applying means, said probe driving means driving said probe to two-dimensionally scan the surface of the second object by changing the position of said probe relative to the first object;

position detecting means for detecting a relative positional relation between the two objects by comparing the two-dimensional information obtained by said probe during the two-dimensional scan by said probe driving means with reference two-dimensional information; and object driving means for executing the relative positioning of the two objects on the basis of the results of the detection by said position detecting means.

34. A processing apparatus for processing a work piece, said apparatus comprising:
   a first member;
   a stage for holding the work piece, said stage being movable relative to said first member;
   processing means, arranged on the first member, for processing the work piece held by said stage;
   a probe for reading information from one of the surface of said first member and the surface of an arrangement comprising said stage and the work piece held on said stage, said probe being provided on the other of one of said first member and said arrangement so as to face the one surface;
   voltage applying means for applying a voltage between said probe and the one surface;
   probe driving means for two-dimensionally scanning the one surface with said probe, said probe reading two-dimensional information from the one surface by the two-dimensional scan, the two-dimensional information being read by detecting a tunnel current flowing between the one surface and said probe to which the voltage has been applied by said voltage applying means, said probe driving means driving the probe to two-dimensionally scan the one surface by changing the position of said probe relative to the other of said first member and said arrangement;
   position detecting means for detecting a relative positional relation between said arrangement and said probe by comparing the two-dimensional information obtained by said probe during the two-dimensional scan by said probe driving means with reference two-dimensional information; and
   stage driving means for driving said stage relative to said first member to execute the relative positioning between said processing means and the work piece, on the basis of the results of the detection by said position detecting means.

35. An apparatus for executing a relative positioning of two, relatively movable objects, said apparatus comprising:
   a probe provided on a first one of the two objects so as to face the surface of the second of the two objects, said probe for reading information from the surface of the second object;
   voltage applying means for applying a voltage between said probe and the surface of the second object;
   probe driving means for two-dimensionally scanning the surface of the second object with said probe, said probe reading two-dimensional information regarding the surface of the second object by the two-dimensional scan, the two-dimensional information being read by detecting a tunnel current flowing between the surface of the second object and said probe to which the voltage has been applied by said voltage applying means;
   position detecting means for detecting a relative positional relation between the two objects by comparing the two-dimensional information obtained by said probe during the two-dimensional scan by said probe driving means with reference two-dimensional information; and
   object driving means for executing the relative positioning of the two objects on the basis of the results of the detection by said position detecting means, said object driving means operating independently of said probe driving means.

36. An apparatus for detecting a relative position of two, relatively movable objects, said apparatus comprising:
   a probe provided on a first one of the two objects so as to face the surface of the second of the two objects, said probe for reading information from the surface of the second object;
   voltage applying means for applying a voltage between said probe and the surface of the second object;
   probe driving means for two-dimensionally scanning the surface of the second object with said probe, said probe reading two-dimensional information regarding the surface of the second object by the two-dimensional scan, the two-dimensional information being read by detecting a tunnel current flowing between the surface of the second object and said probe to which the voltage has been applied by said voltage applying means, said probe driving means driving the probe to two-dimensionally scan by changing the position of said probe relative to the first object; and
   position detecting mean for detecting a relative positional relation between the two objects by comparing the two-dimensional information obtained by said probe during the two-dimensional scan by said probe driving means with reference two-dimensional information.

37. A processing apparatus for processing a work piece, said apparatus comprising:
   a first member;
   a stage for holding the work piece, said stage being movable relative to said first member;
   processing means, arranged on said first member, for processing the work piece held by said stage;
   a probe for obtaining a signal from a surface of one of said first member and an arrangement comprising said stage and the work piece held on said stage, said probe being provided on the other one of the arrangement and said first member so as to face the surface of one of the arrangement and said first member, said probe providing a reference, and two-dimensional information regarding the surface of one of the arrangement and said first member being obtained from a signal variation in response to two-dimensional relative movement of the reference and the surface of one of the arrangement and said first member in the surface direction;
   probe driving means for two-dimensionally scanning the surface of one of the arrangement and said first member by said probe, and for driving the reference to effect the two-dimensional scanning;
   position detecting means for detecting a relative positional relation between the arrangement and said probe by comparing the two-dimensional scan by said probe driving means with reference two-dimensional information; and
   stage driving means for driving the stage relative to said first member to execute the relative positioning between said processing means and the work piece on the basis of the result of the detection by said position detecting means, the relative driving of said stage and said first member by said stage driving means being effected independently from the driving of the reference by said probe driving means.

38. An apparatus according to claim 37, wherein the reference provided by said probe is the tip of said probe.

39. An apparatus according to claim 37, wherein said probe is arranged with respect to said first member so as to face the back surface of the work piece held by said stage.

40. An apparatus according to claim 37, wherein said probe driving means causes said probe to two-dimensionally scan during the processing of the work piece by said processing means.

* * * * *

UNITED STATES PATENT AND TRADEMARK OFFICE
CERTIFICATE OF CORRECTION

PATENT NO. : 5,130,554
DATED : July 14, 1992
INVENTOR(S) : Hiroyasu Nose, et al.

It is certified that error appears in the above-identified patent and that said Letters Patent is hereby corrected as shown below:

ON THE COVER PAGE

UNDER "U.S. PATENT DOCUMENTS"

"4,900,030 2/1990 Aoyama" should read --4,900,939 2/1990 Aoyama--.

IN THE DISCLOSURE

COLUMN 7

Line 63, "the first" should read --the $\pm$ first--.

COLUMN 13

Line 67, "of" (third occurrence) should be deleted.

COLUMN 18

Line 26, "detecting mean" should read --detecting means--.

Signed and Sealed this

Seventh Day of September, 1993

Attest:

BRUCE LEHMAN

*Attesting Officer*  *Commissioner of Patents and Trademarks*